(12) United States Patent
Pendharkar et al.

(10) Patent No.: US 9,543,944 B2
(45) Date of Patent: Jan. 10, 2017

(54) DRIVER FOR NORMALLY ON III-NITRIDE TRANSISTORS TO GET NORMALLY-OFF FUNCTIONALITY

(71) Applicant: Texas Instruments Incorporated, Dallas, TX (US)

(72) Inventors: Sameer Pendharkar, Allen, TX (US); Naveen Tipirneni, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/168,458

(22) Filed: May 31, 2016

(65) Prior Publication Data

US 2016/0277021 A1    Sep. 22, 2016

Related U.S. Application Data

(60) Continuation of application No. 14/745,749, filed on Jun. 22, 2015, now Pat. No. 9,379,022, which is a division of application No. 13/789,949, filed on Mar. 8, 2013, now Pat. No. 9,093,301.

(51) Int. Cl.

| | |
|---|---|
| *H03K 17/687* | (2006.01) |
| *H01L 29/20* | (2006.01) |
| *H01L 29/78* | (2006.01) |
| *H01L 29/66* | (2006.01) |
| *H01L 27/088* | (2006.01) |
| *H01L 27/092* | (2006.01) |
| *H03F 3/193* | (2006.01) |
| *H03F 3/195* | (2006.01) |
| *H02M 5/257* | (2006.01) |

(52) U.S. Cl.
CPC ....... *H03K 17/6872* (2013.01); *H01L 27/0883* (2013.01); *H01L 27/092* (2013.01); *H01L 29/2003* (2013.01); *H01L 29/66446* (2013.01); *H01L 29/7833* (2013.01); *H02M 5/2573* (2013.01); *H03F 3/193* (2013.01); *H03F 3/195* (2013.01); *H03K 17/6877* (2013.01)

(58) Field of Classification Search
CPC .................................................. H03K 17/6877
See application file for complete search history.

(56) References Cited

U.S. PATENT DOCUMENTS

| | | | |
|---|---|---|---|
| 6,809,386 B2 | 10/2004 | Chaine et al. | |
| 6,960,807 B2 | 11/2005 | Pendharkar | |
| 7,253,064 B2 | 8/2007 | Chaine et al. | |
| 7,855,575 B1 | 12/2010 | Hsu et al. | |
| 7,903,379 B2 | 3/2011 | Chaine et al. | |
| 8,054,110 B2 * | 11/2011 | Wang ............... | H03K 19/01852 327/108 |

(Continued)

*Primary Examiner* — Evan Pert
(74) *Attorney, Agent, or Firm* — Jacqueline J. Garner; Charles A. Brill; Frank D. Cimino

(57) ABSTRACT

A semiconductor device includes a depletion mode GaN FET and an integrated driver/cascode IC. The integrated driver/cascode IC includes an enhancement mode cascoded NMOS transistor which is connected in series to a source node of the GaN FET. The integrated driver/cascode IC further includes a driver circuit which conditions a gate input signal and provides a suitable digital waveform to a gate node of the cascoded NMOS transistor. The cascoded NMOS transistor and the driver circuit are formed on a same silicon substrate.

7 Claims, 9 Drawing Sheets

(56) References Cited

U.S. PATENT DOCUMENTS

| | | | | |
|---|---|---|---|---|
| 8,084,783 B2* | 12/2011 | Zhang | ................ | H01L 27/0605 |
| | | | | 257/109 |
| 8,471,622 B2* | 6/2013 | Ishikawa | .......... | H03K 17/08128 |
| | | | | 327/108 |
| 8,526,207 B2* | 9/2013 | Yamagiwa | ........ | H01L 29/42316 |
| | | | | 327/109 |
| 8,536,931 B2 | 9/2013 | Kobayashi et al. | | |
| 8,847,235 B2* | 9/2014 | Rose | ................ | H03K 17/08122 |
| | | | | 257/76 |
| 8,947,154 B1* | 2/2015 | Shah | .................... | H03K 17/687 |
| | | | | 327/427 |
| 9,116,533 B2* | 8/2015 | Buthker | .................. | G05F 3/247 |
| 9,171,837 B2* | 10/2015 | Rutter | ................ | H01L 23/49531 |
| 9,190,826 B2* | 11/2015 | Pansier | .............. | H03K 17/0822 |
| 9,369,121 B2* | 6/2016 | Jeon | ..................... | H03K 17/162 |
| 2014/0070627 A1 | 3/2014 | Briere et al. | | |
| 2014/0167112 A1 | 6/2014 | Briere | | |
| 2014/0175454 A1 | 6/2014 | Roberts et al. | | |
| 2014/0346569 A1 | 11/2014 | Vielemeyer et al. | | |

\* cited by examiner

US 9,543,944 B2

DRIVER FOR NORMALLY ON III-NITRIDE TRANSISTORS TO GET NORMALLY-OFF FUNCTIONALITY

CROSS REFERENCE TO RELATED APPLICATIONS

This application is a continuation of U.S. Nonprovisional patent application Ser. No. 14/745,749, filed Jun. 22, 2015, which is a divisional of U.S. Nonprovisional patent Ser. No. 13/789,949, filed Mar. 8, 2013, (now U.S. Pat. No. 9,093, 301), the contents of both of which are herein incorporated by reference in its entirety.

FIELD OF THE INVENTION

This invention relates to the field of semiconductor devices. More particularly, this invention relates to gallium nitride FTEs in semiconductor devices.

BACKGROUND OF THE INVENTION

Field effect transistors (FETs) made of III-N materials such as gallium nitride (GaN) exhibit desirable properties for power switches, such as high bandgaps and high thermal conductivity compared to silicon FETs. Depletion mode GaN FETs are simpler and less expensive to fabricate than enhancement mode GaN FETs, and so may be desired for power switch semiconductor devices. However, it may also be desirable for a power switch to have a high impedance in an unpowered stated, which is not realized in a depletion mode GaN FET.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes a depletion mode GaN FET and an integrated driver/cascode integrated circuit (IC). The integrated driver/cascode IC includes an enhancement mode cascoded n-channel metal oxide semiconductor (NMOS) transistor which is connected in series to a source node of the GaN FET. The integrated driver/cascode IC further includes a driver circuit which conditions a gate input signal and provides a suitable digital waveform to a gate node of the cascoded NMOS transistor. The cascoded NMOS transistor and the driver circuit are formed on a same silicon substrate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device includes a depletion mode GaN FET and an integrated driver/cascode IC. The integrated driver/cascode IC includes an enhancement mode cascoded NMOS transistor which is connected in series to a source node of the GaN FET. The integrated driver/cascode IC further includes a driver circuit which conditions a gate input signal and provides a suitable digital waveform to a gate node of the cascoded NMOS transistor. The cascoded NMOS transistor and the driver circuit are formed on a same silicon substrate.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. For the purposes of this description, the term GaN FET is understood to refer to a field effect transistor which includes III-N semiconductor materials.

Figure 1:
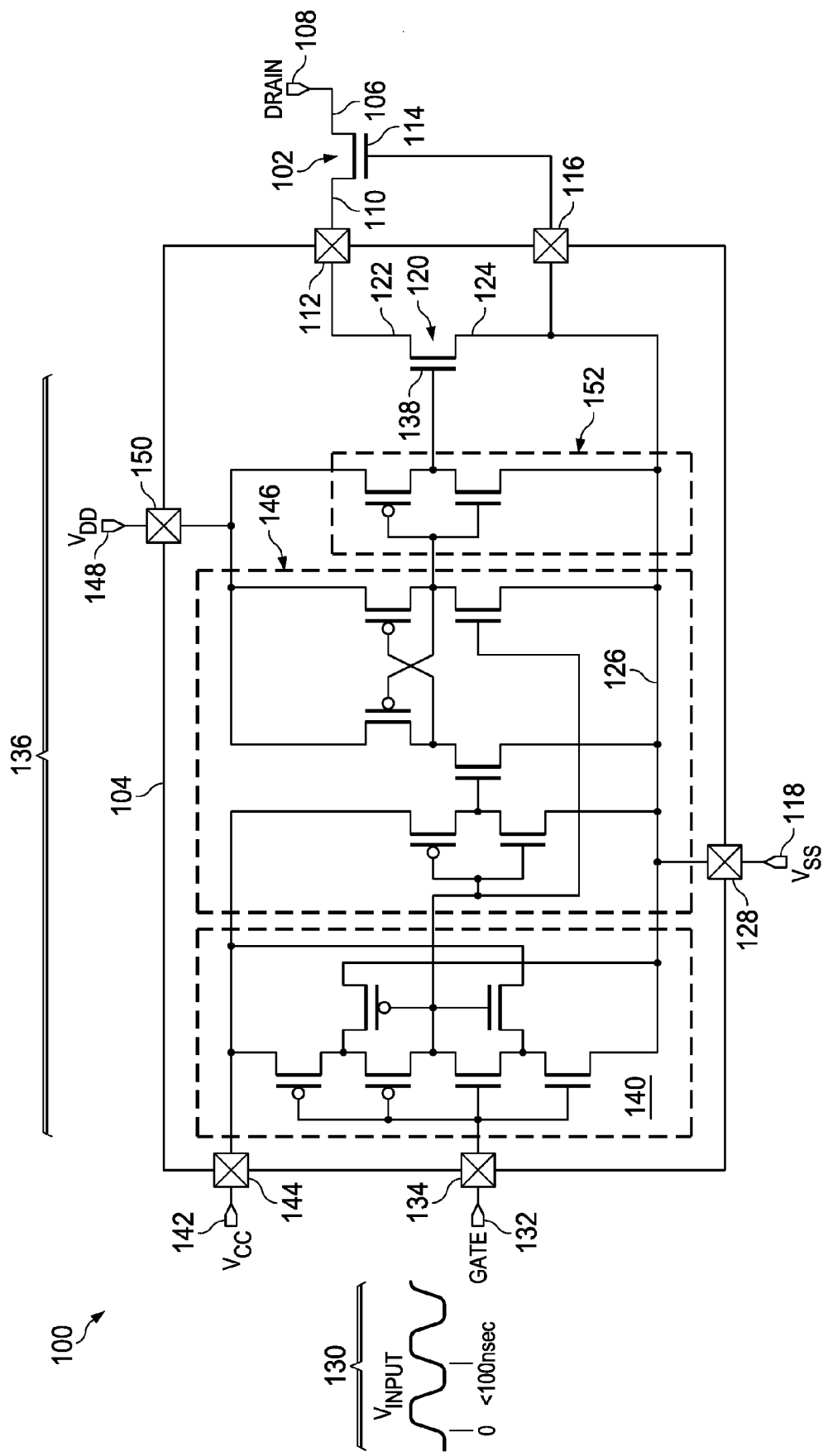
FIG. 1 is a schematic diagram of a semiconductor device containing a depletion mode GaN FET and an integrated driver/cascode IC.

FIG. 1 is a schematic diagram of a semiconductor device 100 containing a depletion mode GaN FET 102 and an integrated driver/cascode IC 104. A drain node 106 of the GaN FET 102 is connected to a drain input terminal 108 of the semiconductor device 100. A source node 110 of the GaN FET 102 is connected to an upper cascode input/output (I/O) port 112 of the integrated driver/cascode IC 104. A gate node 114 of the GaN FET 102 may be connected to a lower cascode I/O port 116 of the integrated driver/cascode IC 104, or, alternatively, may be connected to a Vss terminal 118 of the semiconductor device 100.

The integrated driver/cascode IC 104 includes an enhancement mode cascoded NMOS transistor 120. A drain node 122 of the cascoded NMOS transistor 120 is connected to the upper cascode I/O port 112. A source node 124 of the cascoded NMOS transistor 120 is connected to an internal Vss node 126 of the integrated driver/cascode IC 104. The internal Vss node 126 is connected to the Vss terminal 118 of the semiconductor device 100 through a Vss port 128 of the integrated driver/cascode IC 104. If the gate node 114 of the GaN FET 102 is connected to the lower cascode I/O port 116, then the internal Vss node 126 is connected to the lower cascode I/O port 116.

Gate input signals 130 are provided to a gate terminal 132 of the semiconductor device 100, which is connected to a gate I/O port 134 of the integrated driver/cascode IC 104. The gate input signals 130 may have a period less than 100 nanoseconds, which is a frequency higher than 10 megahertz (MHz). The integrated driver/cascode IC 104 conditions the gate input signals 130 through a driver circuit 136 and provides a suitable digital waveform to a gate node 138 of the cascoded NMOS transistor 120. The driver circuit 136 may include, for example, an edge detector circuit 140 such as the Schmitt trigger circuit depicted in FIG. 1, to provide a suitably sharp signal corresponding to rising and falling portions of the gate input signals 130. Power may be provided to the edge detector circuit 140 by a Vcc terminal 142 of the semiconductor device 100 connected through a Vcc port 144 of the integrated driver/cascode IC 104.

The driver circuit 136 may also include, for example, a level shifter circuit 146 which receives the signal from the edge detector circuit 140 and provide a higher or lower voltage signal appropriate for driving the cascoded NMOS transistor 120. Power for the level shifter circuit 146 may be provided through the Vcc terminal 142 and through a Vdd terminal 148 of the semiconductor device 100 connected through a Vdd port 150 of the integrated driver/cascode IC 104.

The driver circuit 136 may further include, for example, a driver buffer 152, which accepts the voltage signal from the level shifter circuit 146 and provides a drive signal with suitable current to the gate node 138 of the cascoded NMOS transistor 120. The driver buffer 152 may be connected to the Vdd port 150 so that power may be supplied to the driver buffer 152 through the Vdd terminal 142 of the semiconductor device 100. Other circuits and components may be included in the driver circuit 136 within the scope of the instant example.

Figure 2A:
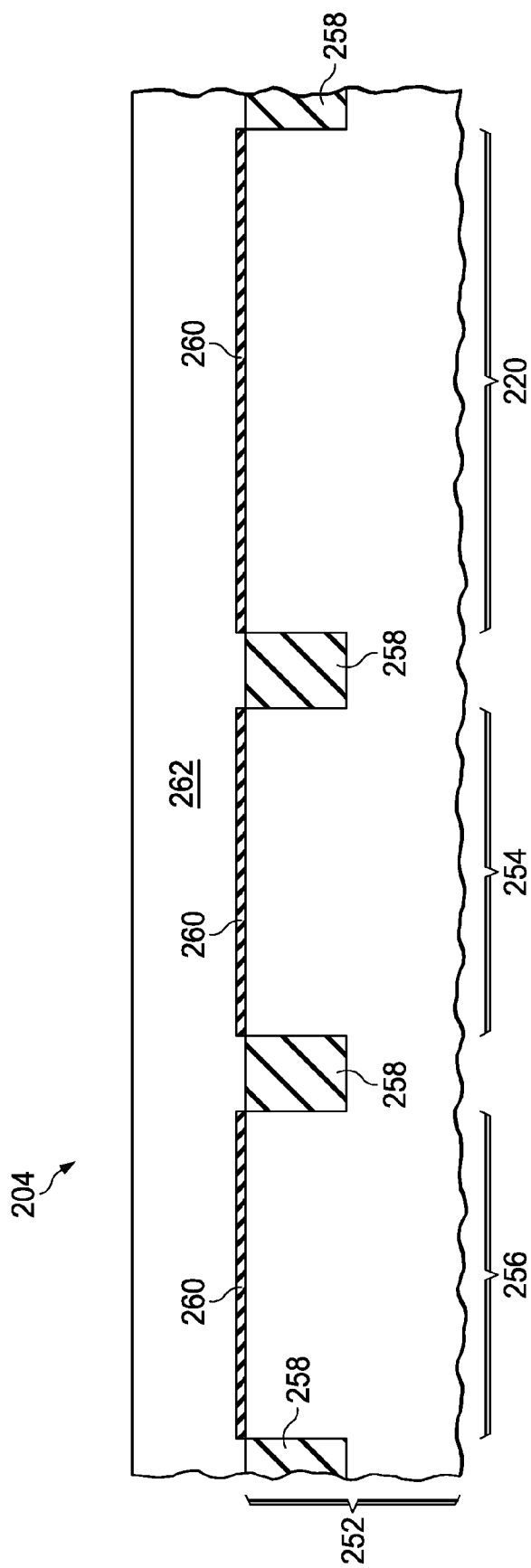
FIG. 2A through FIG. 2C are cross sections of an exemplary integrated driver/cascode IC, depicted in successive stages of fabrication.
Figure 2B:
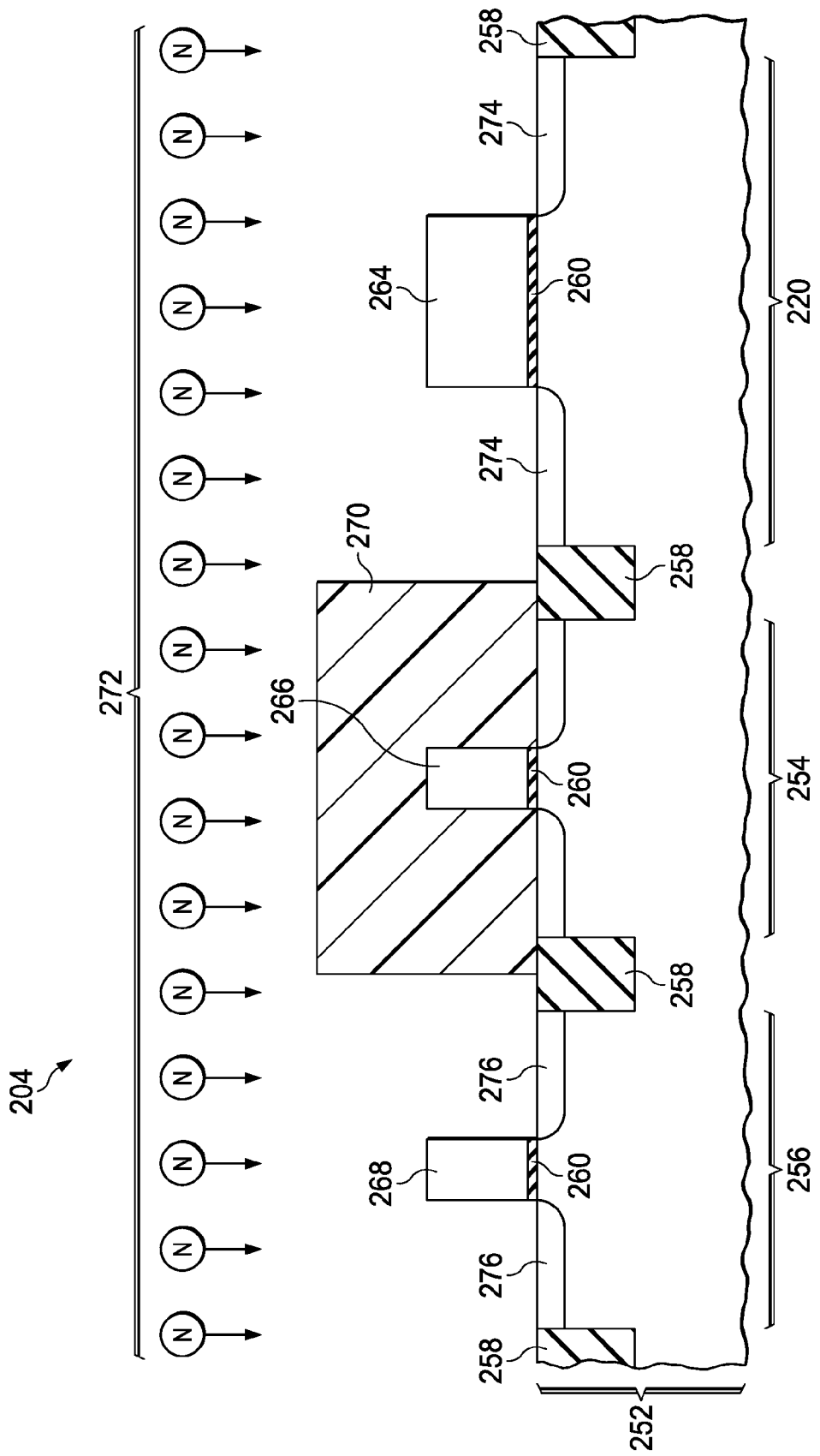
Figure 2C:
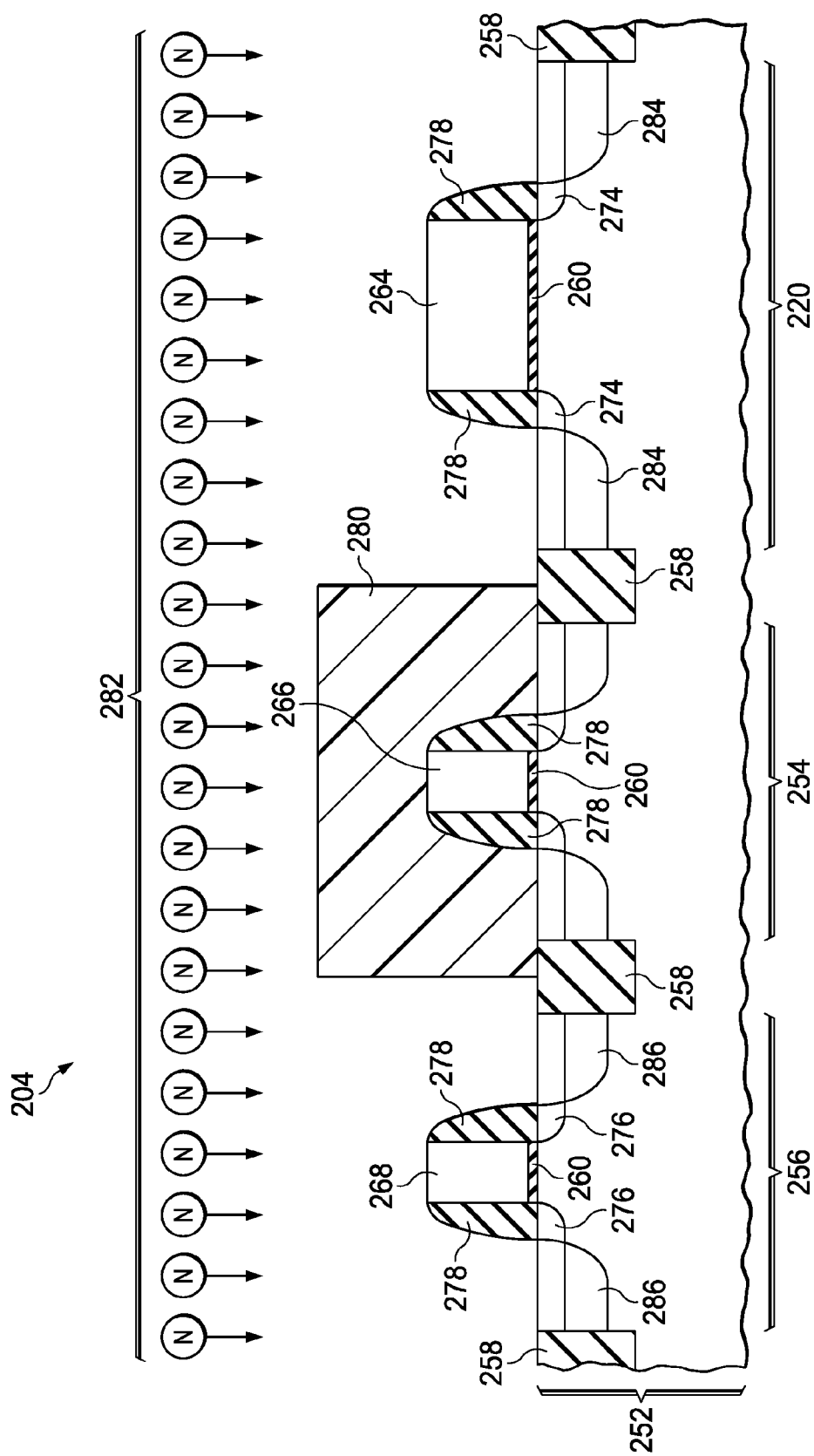

FIG. 2A through FIG. 2C are cross sections of an exemplary integrated driver/cascode IC, depicted in successive stages of fabrication. Referring to FIG. 2A, the integrated driver/cascode IC 204 is formed in a silicon substrate 252. The silicon substrate 252 may be, for example, a single crystal silicon wafer, a silicon-on-insulator (SOI) wafer, a hybrid orientation technology (HOT) wafer with regions of different crystal orientations, or other silicon substrate appropriate for fabrication of the integrated driver/cascode IC 204. The integrated driver/cascode IC 204 includes an area for an enhancement mode cascoded NMOS transistor 220, an area for a driver circuit p-channel metal oxide semiconductor (PMOS) transistor 254 and an area for a driver circuit NMOS transistor 256. The driver circuit PMOS transistor 254 and the driver circuit NMOS transistor 256 are components in one or more circuits of the integrated driver/cascode IC 204, for example, a driver buffer, a level shifter circuit or an edge detector circuit, as described in reference to FIG. 1.

Elements of field oxide 258 may be formed at a top surface of the silicon substrate 252 so as to laterally isolate the area for the cascoded NMOS transistor 220, the area for the driver circuit PMOS transistor 254 and the area for the driver circuit NMOS transistor 256. The field oxide 258 may be formed, for example, by a show trench isolation (STI) process or a local oxidation of silicon (LOCOS) process.

A gate dielectric layer 260 is formed at the top surface of the silicon substrate 252, concurrently in the area for the cascoded NMOS transistor 220, the area for the driver circuit PMOS transistor 254 and the area for the driver circuit NMOS transistor 256. The gate dielectric layer 260 may include, for example, one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer 260 may include nitrogen as a result of exposure to a nitrogen-containing plasma or a nitrogen-containing ambient gas at temperatures between 50 C and 800 C. The gate dielectric layer 260 may be 10 to 14 nanometers thick for a 5 volt gate-source operational voltage, or may be 30 to 36 nanometers thick for 12 volt operation. The gate dielectric layer 260 may be formed by any of a variety of gate dielectric formation processes, for example thermal oxidation, plasma nitridation of an oxide layer, and/or dielectric material deposition by atomic layer deposition (ALD).

A layer of gate material 262 is formed over the gate dielectric layer 260, concurrently in the area for the cascoded NMOS transistor 220, the area for the driver circuit PMOS transistor 254 and the area for the driver circuit NMOS transistor 256. The layer of gate material 262 may include, for example, 50 to 500 nanometers of polycrystalline silicon. Other gate materials such as titanium nitride are within the scope of the instant example. The gate dielectric layer 260 and the layer of gate material 262 are subsequently patterned to form gate structures in the area for the cascoded NMOS transistor 220, the area for the driver circuit PMOS transistor 254 and the area for the driver circuit NMOS transistor 256. Forming the layer of gate material 262 and the gate dielectric layer 260 concurrently in the area for the cascoded NMOS transistor 220, the area for the driver circuit PMOS transistor 254 and the area for the driver circuit NMOS transistor 256 may advantageously reduce a fabrication complexity and a fabrication cost of the integrated driver/cascode IC 204.

Referring to FIG. 2B, the area for the cascoded NMOS transistor 220 contains a gate structure which includes a cascoded NMOS gate 264 on the gate dielectric layer 260, the area for the driver circuit PMOS transistor 254 contains a gate structure which includes a driver circuit PMOS gate 266 on the gate dielectric layer 260, and the area for the driver circuit NMOS transistor 256 contains a gate structure which includes a driver circuit NMOS gate 268 on the gate dielectric layer 260. The gate dielectric layer 260 in the area for the cascoded NMOS transistor 220 has substantially a same thickness as the gate dielectric layer 260 in the area for the driver circuit NMOS transistor 256, as a consequence of forming the gate dielectric layer 260 concurrently in the area for the cascoded NMOS transistor 220 and the area for the driver circuit NMOS transistor 256.

An n-channel lightly doped drain (NLDD) implant mask 270 is formed over the area for the driver circuit PMOS transistor 254. An NLDD implant process 272 implants n-type dopants such as phosphorus and arsenic, and possibly antimony, into the silicon substrate 252, to form cascoded NMOS NLDD regions 274 adjacent to the cascoded NMOS gate 264 and to concurrently form driver circuit NMOS NLDD regions 276 adjacent to the driver circuit NMOS gate 268. Forming the cascoded NMOS NLDD regions 274 and the driver circuit NMOS NLDD regions 276 concurrently may advantageously reduce the fabrication complexity and the fabrication cost of the integrated driver/cascode IC 204.

Referring to FIG. 2C, gate sidewall spacers 278 are formed on sides of the cascoded NMOS gate 264, the driver circuit PMOS gate 266, and the driver circuit NMOS gate 268. An n-channel source/drain (NSD) implant mask 280 is formed over the area for the driver circuit PMOS transistor 254. An NSD implant process 282 implants n-type dopants such as phosphorus and arsenic, into the silicon substrate 252, to form cascoded NMOS NSD regions 284 adjacent to the gate sidewall spacers 278 on the cascoded NMOS gate 264 and to concurrently form driver circuit NMOS NSD regions 286 adjacent to the gate sidewall spacers 278 on the driver circuit NMOS gate 268. Forming the cascoded NMOS NSD regions 284 and the driver circuit NMOS NSD regions 286 concurrently may advantageously reduce the fabrication complexity and the fabrication cost of the integrated driver/cascode IC 204.

Figure 3A:
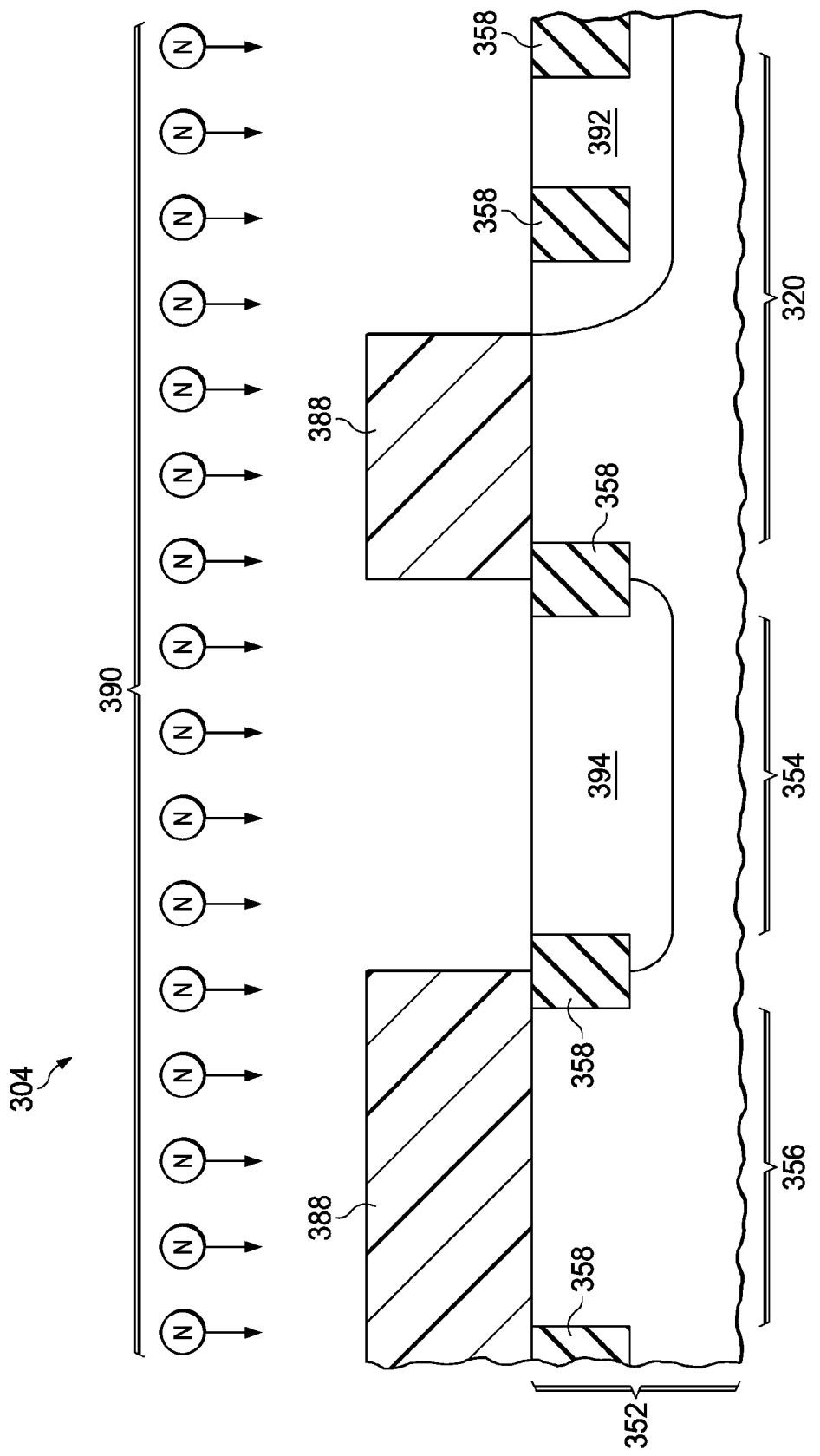
FIG. 3A through FIG. 3D are cross sections of another exemplary integrated driver/cascode IC, depicted in successive stages of fabrication.

FIG. 3A through FIG. 3D are cross sections of another exemplary integrated driver/cascode IC, depicted in successive stages of fabrication. Referring to FIG. 3A, the integrated driver/cascode IC 304 is formed in a silicon substrate 352, as described in reference to FIG. 2A. The integrated driver/cascode IC 304 includes an area for an enhancement mode cascoded drain-extended NMOS transistor 320, an area for a driver circuit PMOS transistor 354 and an area for a driver circuit NMOS transistor 356. The driver circuit PMOS transistor 354 and the driver circuit NMOS transistor 356 are components in one or more circuits of the integrated driver/cascode IC 304, for example, a driver buffer, a level shifter circuit or an edge detector circuit, as described in reference to FIG. 1. Elements of field oxide 358 may be formed at a top surface of the silicon substrate 352 so as to laterally isolate the area for the cascoded drain-extended NMOS transistor 320, the area for the driver circuit PMOS transistor 354 and the area for the driver circuit NMOS transistor 356. an element of field oxide 358 is also formed in a drain region of the area for the cascoded drain-extended NMOS transistor 320 to be part of an extended drain structure.

A well implant mask 388 is formed over the area for the driver circuit NMOS transistor 356 and over a source portion of the area for the cascoded drain-extended NMOS transistor 320. An n-well implant process 390 is performed which implants n-type dopants such as phosphorus into the silicon substrate 352 in a drain portion of the area for the cascoded drain-extended NMOS transistor 320 to form an n-type drain extension well 392, and concurrently implants the n-type dopants in the area for the driver circuit PMOS transistor 354 to form an n-type PMOS well 394. Forming the drain extension well 392 and the PMOS well 394 concurrently may advantageously reduce a fabrication complexity and a fabrication cost of the integrated driver/cascode IC 304.

Figure 3B:
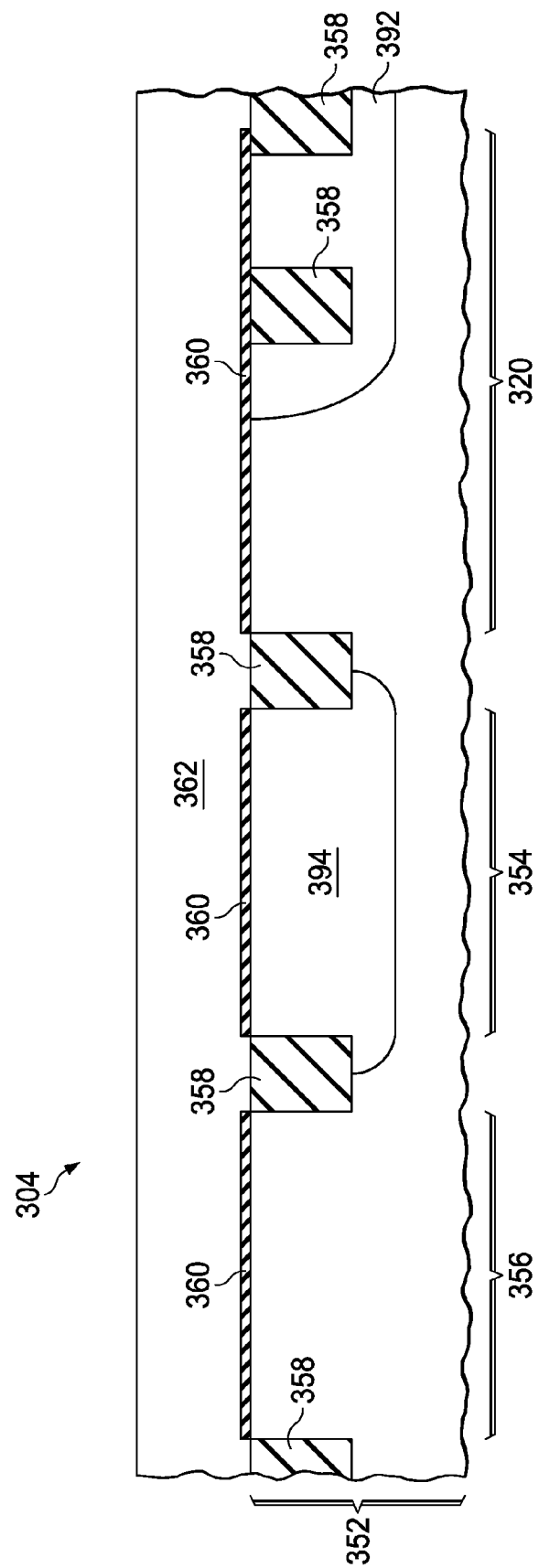

Referring to FIG. 3B, a gate dielectric layer 360 is formed at the top surface of the silicon substrate 352, concurrently in the area for the cascoded drain-extended NMOS transistor 320, the area for the driver circuit PMOS transistor 354 and the area for the driver circuit NMOS transistor 356, as described in reference to FIG. 2A. A layer of gate material 362 is formed over the gate dielectric layer 360, concurrently in the area for the cascoded drain-extended NMOS transistor 320, the area for the driver circuit PMOS transistor 354 and the area for the driver circuit NMOS transistor 356, as described in reference to FIG. 2A. Forming the layer of gate material 362 and the gate dielectric layer 360 concurrently in the area for the cascoded drain-extended NMOS transistor 320, the area for the driver circuit PMOS transistor 354 and the area for the driver circuit NMOS transistor 356 may advantageously reduce a fabrication complexity and a fabrication cost of the integrated driver/cascode IC 304.

Figure 3C:
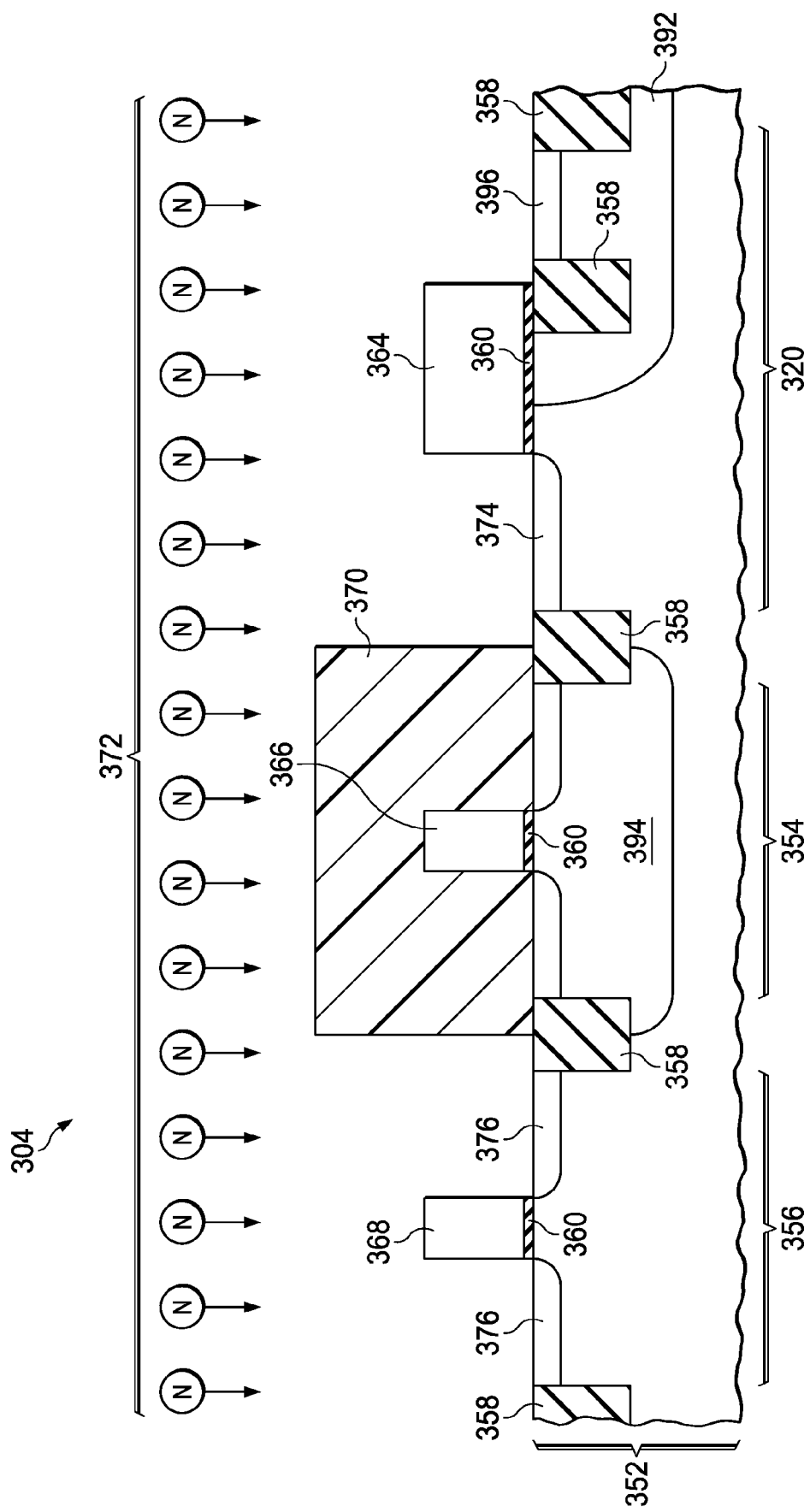

Referring to FIG. 3C, the area for the cascoded drain-extended NMOS transistor 320 contains a gate structure which includes a cascoded drain-extended NMOS gate 364 on the gate dielectric layer 360, the area for the driver circuit PMOS transistor 354 contains a gate structure which includes a driver circuit PMOS gate 366 on the gate dielectric layer 360, and the area for the driver circuit NMOS transistor 356 contains a gate structure which includes a driver circuit NMOS gate 368 on the gate dielectric layer 360. The gate dielectric layer 360 in the area for the cascoded drain-extended NMOS transistor 320 has substantially a same thickness as the gate dielectric layer 360 in the area for the driver circuit NMOS transistor 356, as a consequence of forming the gate dielectric layer 360 concurrently in the area for the cascoded drain-extended NMOS transistor 320 and the area for the driver circuit NMOS transistor 356. The cascoded drain-extended NMOS gate 364 overlaps the drain extension well 392 and may overlap the element of field oxide 358 in the drain region.

An NLDD implant mask 370 is formed over the area for the driver circuit PMOS transistor 354. An NLDD implant process 372 implants n-type dopants such as phosphorus and arsenic, and possibly antimony, into the silicon substrate 352, to form a cascoded NMOS NLDD source-side region 374 adjacent to the cascoded drain-extended NMOS gate 364 and a cascoded NMOS NLDD drain-side region 396 proximate to, but not adjacent to, the cascoded drain-extended NMOS gate 364, and to concurrently form driver circuit NMOS NLDD regions 376 adjacent to the driver circuit NMOS gate 368. Forming the cascoded NMOS NLDD source-side region 374 and the cascoded NMOS NLDD drain-side region 396 concurrently with the driver circuit NMOS NLDD regions 376 may advantageously reduce the fabrication complexity and the fabrication cost of the integrated driver/cascode IC 304.

Figure 3D:
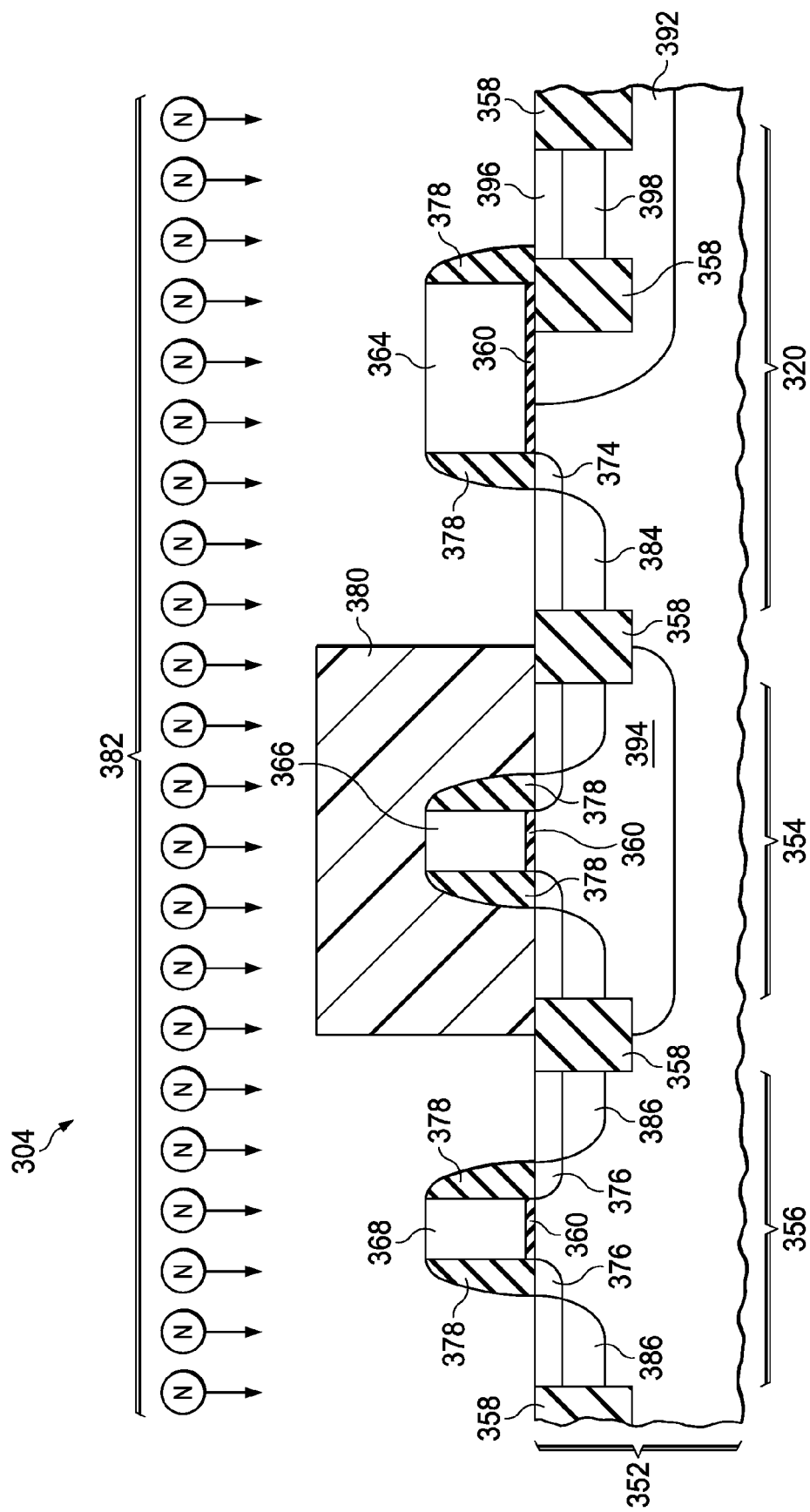

Referring to FIG. 3D, gate sidewall spacers 378 are formed on sides of the cascoded drain-extended NMOS gate 364, the driver circuit PMOS gate 366, and the driver circuit NMOS gate 368. An n-channel source/drain (NSD) implant mask 380 is formed over the area for the driver circuit PMOS transistor 354. An NSD implant process 382 implants n-type dopants such as phosphorus and arsenic, into the silicon substrate 352, to form a cascoded NMOS source region 384 adjacent to the gate sidewall spacer 378 on the cascoded drain-extended NMOS gate 364 and a cascoded NMOS drain contact region 398 proximate to, but not adjacent to, the gate sidewall spacer 378 on the cascoded drain-extended NMOS gate 364, and to concurrently form driver circuit NMOS NSD regions 386 adjacent to the gate sidewall spacers 378 on the driver circuit NMOS gate 368. Forming the cascoded NMOS source region 384 and the cascoded NMOS drain contact region 398 concurrently with the driver circuit NMOS NSD regions 386 may advantageously reduce the fabrication complexity and the fabrication cost of the integrated driver/cascode IC 304.

Figure 4A:
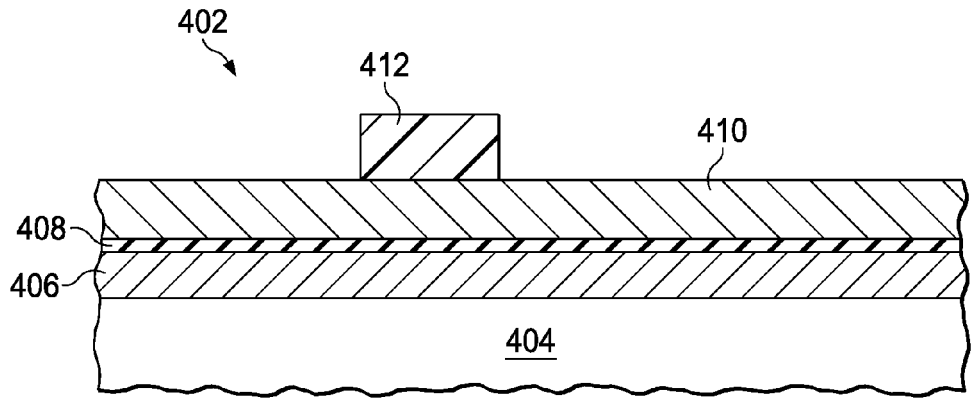
FIG. 4A through FIG. 4C are cross sections of a depletion mode GaN FET depicted in successive stages of fabrication.
Figure 4B:
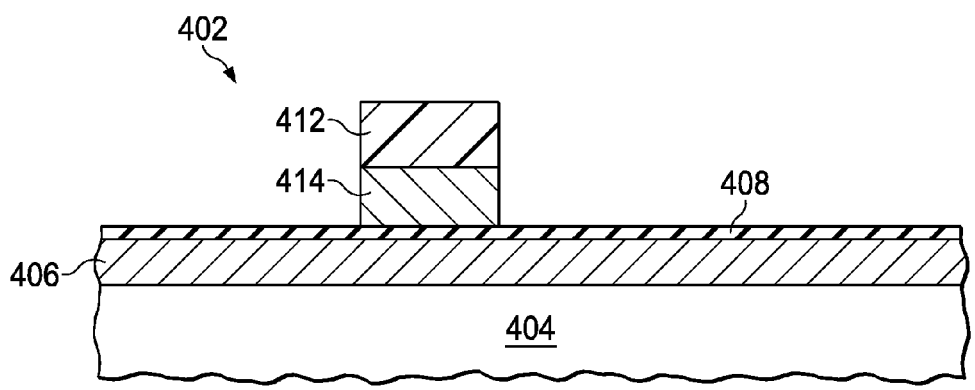
Figure 4C:
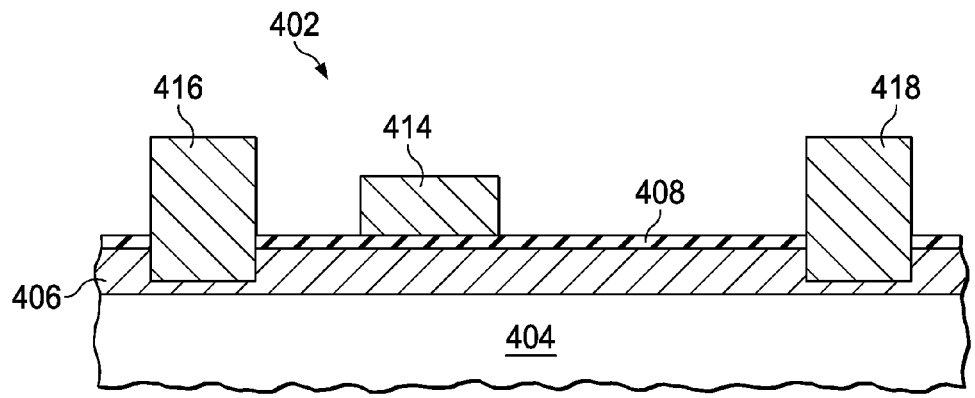

FIG. 4A through FIG. 4C are cross sections of a depletion mode GaN FET depicted in successive stages of fabrication. Referring to FIG. 4A, the GaN FET 402 has a low-defect layer 404 of III-N semiconductor material with a barrier layer 406 formed on a top surface of the low-defect layer 404. Forming the barrier layer 406 on the low-defect layer 404 generates a two-dimensional electron gas in the low-defect layer 404 just below the barrier layer 406 with an electron density of, for example, $1 \times 10^{12}$ to $2 \times 10^{13}$ cm$^{-2}$. The low-defect layer 404 may include, for example, primarily gallium nitride, and have a low impurity concentration so as to provide a desired mobility of electrons in the two-dimensional electron gas. The barrier layer 406 may be, for example, 2 to 30 nanometers of $Al_xGa_{1-x}N$ or $In_xAl_yGa_{1-x-y}N$. An exemplary composition of the barrier layer 406 may be 24 to 28 percent aluminum nitride, 62 to 66 percent gallium nitride and 8 to 12 percent indium nitride. An optional cap layer 408 may be formed on the barrier layer 406. The cap layer 408 may be, for example, 2 to 5 nanometers of gallium nitride. An optional gate dielectric layer, not shown in FIG. 4A, may be formed over the cap layer 408 to form a version of the GaN FET 402 with an insulated gate.

A layer of gate material 410 is formed over the barrier layer 406 and over the cap layer 408 if present. In one version of the instant example, the layer of gate material 410 may include metal, such as titanium tungsten. In an alternate version, the layer of gate material 410 may include III-N semiconductor material, such as gallium nitride or aluminum gallium nitride.

A gate etch mask 412 is formed over the layer of gate material 410 which covers an area defined for a gate of the GaN FET 402. The gate etch mask 412 may include 50 to 500 nanometers of photoresist formed by a photolithographic process.

Referring to FIG. 4B, a gate material in the layer of gate material 410 of FIG. 4A which is exposed by the gate etch mask 412 is removed in a gate etch process to leave a gate 414 disposed over the barrier layer 406 and over the cap layer 408 if present. The gate etch mask 412 is removed after the gate etch process is completed. Alternately, the gate 414 may be formed using a liftoff process.

Referring to FIG. 4C, a source contact 416 and a drain contact 418 are formed in the barrier layer 406. Bottom surfaces of the source contact 416 and the drain contact 418 may be formed proximate to the low-defect layer 404 so as to form tunneling connections to the two-dimensional electron gas.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a depletion mode GaN FET;
   an integrated driver/cascode transistor IC having an upper cascode I/O port, a lower cascode I/O port, a gate I/O port, a Vss port, a $V_{DD}$ port, a Vcc port, and further including:
   a cascoded NMOS transistor in a silicon substrate, the cascoded NMOS transistor having a drain connected to the upper cascode I/O port and a source connected to the lower cascode I/O port; and
   a driver circuit in said silicon substrate, so that a gate node of said cascoded NMOS transistor is connected to said driver circuit, wherein the driver circuit includes:
      an edge detector circuit connected to the gate I/O port;
      a level shifter circuit connected to the edge detector circuit; and
      a driver buffer connected between the level shifter circuit and the cascoded NMOS transistor;
   an electrical connection between a drain node of said GaN FET and a drain terminal of said semiconductor device;
   an electrical connection between a source node of said GaN FET and the upper cascode I/O port;
   an electrical connection between a gate node of the GaN FET and the lower cascode I/O port;
   an electrical connection between the gate I/O port and a gate terminal of the semiconductor device; and
   an electrical connection between the Vss port and a Vss terminal of the semiconductor device.

2. The semiconductor device of claim 1, wherein said cascoded NMOS transistor includes a gate dielectric layer 10 to 14 nanometers thick.

3. The semiconductor device of claim 1, wherein said cascoded NMOS transistor includes an n-type drain extension well in said silicon substrate, so that a gate of said cascoded NMOS transistor overlaps said drain extension well.

4. The semiconductor device of claim 1, wherein said driver circuit includes a gate dielectric layer in said cascoded NMOS transistor and a concurrently formed gate dielectric layer in a driver circuit NMOS transistor of said driver circuit, so that said gate dielectric layer in said cascoded NMOS transistor has substantially a same thickness as said gate dielectric layer in said driver circuit NMOS transistor.

5. The semiconductor device of claim 1, wherein said driver circuit includes concurrently formed first n-type lightly doped drain (NLDD) region in said cascoded NMOS transistor and second NLDD region in a driver circuit NMOS transistor of said driver circuit.

6. The semiconductor device of claim 1, wherein said depletion mode GaN FET includes a gate which includes metal.

7. The semiconductor device of claim 1, wherein said depletion mode GaN FET includes a gate which includes III-N semiconductor material.

* * * * *